US010813246B2

(12) United States Patent
Lin

(10) Patent No.: US 10,813,246 B2
(45) Date of Patent: Oct. 20, 2020

(54) CHASSIS HEAT DISSIPATION STRUCTURE

(71) Applicant: ASIA VITAL COMPONENTS (CHINA) CO., LTD., Shenzhen (CN)

(72) Inventor: Yuan-Yi Lin, Shenzhen (CN)

(73) Assignee: ASIA VITAL COMPONENTS (CHINA) CO., LTD., Shenzhen (CN)

( * ) Notice: Subject to any disclaimer, the term of this patent is extended or adjusted under 35 U.S.C. 154(b) by 14 days.

(21) Appl. No.: 15/790,074

(22) Filed: Oct. 23, 2017

(65) Prior Publication Data

US 2019/0124788 A1   Apr. 25, 2019

(51) Int. Cl.
*H05K 7/20* (2006.01)
*H05K 7/14* (2006.01)

(52) U.S. Cl.
CPC ....... *H05K 7/20154* (2013.01); *H05K 7/1488* (2013.01); *H05K 7/20736* (2013.01); *H05K 7/20809* (2013.01)

(58) Field of Classification Search
CPC .......... H05K 7/20672; H05K 7/20809; H05K 7/20154; H05K 7/20736
See application file for complete search history.

(56) References Cited

U.S. PATENT DOCUMENTS

| | | | | |
|---|---|---|---|---|
| 6,247,944 B1 * | 6/2001 | Bolognia | ................ | G06F 1/184 439/157 |
| 6,776,221 B2 * | 8/2004 | Montgomery | ........ | F28D 15/043 165/104.14 |
| 6,796,372 B2 * | 9/2004 | Bear | ........................ | F28F 13/00 165/104.21 |
| 6,819,563 B1 * | 11/2004 | Chu | .................... | G11B 33/1406 165/104.33 |
| 7,543,629 B2 * | 6/2009 | Chin | ..................... | F28D 15/043 165/104.21 |
| 7,719,837 B2 * | 5/2010 | Wu | ........................ | G06F 1/183 165/104.26 |
| 7,826,217 B2 * | 11/2010 | Kondo | ...................... | G06F 1/20 165/104.21 |
| 7,830,657 B2 * | 11/2010 | Chu | ..................... | H05K 7/2079 165/104.33 |
| 7,839,640 B2 * | 11/2010 | Hayashi | .................. | G06F 1/185 165/104.33 |
| 8,305,754 B2 * | 11/2012 | Wu | .................... | H05K 7/20781 165/104.21 |

(Continued)

*Primary Examiner* — Courtney L Smith
(74) *Attorney, Agent, or Firm* — Demian K. Jackson; Jackson IPG PLLC

(57) ABSTRACT

A chassis heat dissipation structure includes a chassis main body. The chassis main body has a chassis support, a thermal module and at least one heat conduction unit. At least one server mainframe is disposed on the chassis support. The thermal module has at least one heat dissipation unit and multiple fan units. The heat dissipation unit is disposed between the fan units and the server mainframe. The heat conduction unit has at least one first end and a second end. The first end is in contact with a heat generation module of the server mainframe. The second end is in contact with the heat dissipation unit. The heat conduction unit serves to conduct the heat of the heat generation module to the heat dissipation unit. The fan units serve to carry away the heat of the heat dissipation unit to dissipate the heat.

16 Claims, 14 Drawing Sheets

(56) References Cited

U.S. PATENT DOCUMENTS

| | | | | |
|---|---|---|---|---|
| 9,013,873 B2* | 4/2015 | Wei | H05K 7/20781 | 165/104.33 |
| 2003/0128515 A1* | 7/2003 | Faneuf | G06F 1/20 | 361/700 |
| 2003/0128517 A1* | 7/2003 | Faneuf | H05K 7/20809 | 361/704 |
| 2003/0128525 A1* | 7/2003 | Berry | G06F 1/183 | 361/726 |
| 2008/0236797 A1* | 10/2008 | Miyazaki | F28D 15/0266 | 165/104.29 |
| 2010/0073866 A1* | 3/2010 | Toyoda | F28D 15/043 | 361/679.47 |
| 2010/0188818 A1* | 7/2010 | Li | F28D 15/0266 | 361/700 |
| 2011/0277967 A1* | 11/2011 | Fried | F28D 15/0266 | 165/104.26 |
| 2011/0304981 A1* | 12/2011 | Huang | G06F 1/20 | 361/679.48 |
| 2012/0261095 A1* | 10/2012 | Wu | F28F 21/06 | 165/104.26 |
| 2013/0063888 A1* | 3/2013 | Wang | H05K 7/20736 | 361/679.48 |
| 2013/0063894 A1* | 3/2013 | Wang | H05K 7/1492 | 361/692 |
| 2013/0077232 A1* | 3/2013 | Nordin | H05K 7/20809 | 361/679.47 |
| 2013/0083481 A1* | 4/2013 | Goto | H05K 7/20209 | 361/695 |
| 2013/0205822 A1* | 8/2013 | Heiland | F25D 31/00 | 62/259.2 |
| 2014/0078663 A1* | 3/2014 | Xu | G06F 1/20 | 361/679.32 |
| 2014/0146468 A1* | 5/2014 | Campbell | H05K 7/20236 | 361/679.53 |
| 2014/0318152 A1* | 10/2014 | Ghoshal | F25B 21/02 | 62/3.2 |
| 2015/0009620 A1* | 1/2015 | Kadotani | H05K 7/20809 | 361/679.47 |
| 2015/0136362 A1* | 5/2015 | Yoshikawa | H01L 23/427 | 165/104.21 |
| 2016/0021791 A1* | 1/2016 | Bosak | F28D 15/0275 | 165/104.21 |
| 2016/0205809 A1* | 7/2016 | Aoki | H05K 7/20772 | 361/699 |
| 2017/0242463 A1* | 8/2017 | Matteson | G06F 1/206 | |
| 2017/0303441 A1* | 10/2017 | Farshchian | H05K 7/20327 | |
| 2017/0339805 A1* | 11/2017 | Lassini | H05K 7/2039 | |
| 2018/0011522 A1* | 1/2018 | Shirakami | G06F 1/206 | |
| 2018/0246550 A1* | 8/2018 | Inaba | G06F 1/20 | |

* cited by examiner

CHASSIS HEAT DISSIPATION STRUCTURE

BACKGROUND OF THE INVENTION

1. Field of the Invention

The present invention relates generally to a heat dissipation structure, and more particularly to a chassis heat dissipation structure.

2. Description of the Related Art

Along with the advance of sciences and technologies, the operation speed of the server mainframe has been continuously increased. As a result, the heat generation power of the internal electronic components of the server mainframe has continuously risen. In order to avoid overheating of the internal electronic components of the server mainframe so as to prevent the electronic components from failing, sufficient heat dissipation performance must be provided for the electronic components. Therefore, conventionally, a heat dissipation structure is respectively disposed on each server mainframe.

However, the heat dissipation structure disposed on the server mainframe serves to dissipate the heat of the server mainframe. The heat dissipation structure leads to increase of the volume of the server mainframe. Especially, the server mainframes are stacked in the chassis for supporting the server mainframes. In the case that each server mainframe is equipped with more than one heat dissipation structure, the number of the server mainframes supported by the chassis will be reduced. In the condition that the volumes of the server mainframes and the heat dissipation structures cannot be minified, the application efficiency and heat dissipation effect of the internal space of the chassis are poorer.

It is therefore tried by the applicant to provide a chassis heat dissipation structure to solve the above problems of the conventional heat dissipation structure.

SUMMARY OF THE INVENTION

It is therefore a primary object of the present invention to provide a chassis heat dissipation structure, in which the possibility that the thermal module transfers heat to the internal space of the chassis main body is reduced so that the heat dissipation effect for the internal space of the chassis main body is enhanced.

It is a further object of the present invention to provide the above chassis heat dissipation structure, in which the internal space of the chassis main body is not occupied by the thermal module.

It is still a further object of the present invention to provide the above chassis heat dissipation structure, in which the heat conduction unit can be arranged in parallel to the heat generation module or normal to the heat generation module. Therefore, the use flexibility of the internal space of the chassis main body is increased.

To achieve the above and other objects, the chassis heat dissipation structure of the present invention is for at least one server mainframe to dispose thereon. The server mainframe has a heat generation module. The chassis heat dissipation structure includes a chassis main body. The chassis main body has a chassis support, a thermal module and at least one heat conduction unit. The at least one server mainframe is disposed on the chassis support. The thermal module has at least one heat dissipation unit and multiple fan units. The at least one heat dissipation unit is disposed between the fan units and the at least one server mainframe. The at least one heat conduction unit has at least one first end and a second end. The at least one first end is in contact with the heat generation module of the at least one server mainframe. The second end is in contact with the at least one heat dissipation unit of the thermal module. The at least one heat conduction unit serves to conduct the heat of the heat generation module to the at least one heat dissipation unit. The fan units serve to carry away the heat of the at least one heat dissipation unit to dissipate the heat.

In the above chassis heat dissipation structure, the heat generation module has at least one heat source and at least one base seat. The at least one base seat is disposed on the at least one heat source. The at least one first end of the at least one heat conduction unit is in contact with the at least one base seat.

In the above chassis heat dissipation structure, the at least one first end of the at least one heat conduction unit is a free end inserted in the at least one base seat. The second end of the at least one heat conduction unit is a fixed end affixed to the at least one heat dissipation unit of the thermal module.

In the above chassis heat dissipation structure, the at least one first end of the at least one heat conduction unit is a fixed end fixed on the at least one base seat. The second end of the at least one heat conduction unit is a free end inserted in the at least one heat dissipation unit of the thermal module.

In the above chassis heat dissipation structure, the at least one first end of the at least one heat conduction unit is a free end inserted in the at least one base seat. The second end of the at least one heat conduction unit is another free end inserted in the at least one heat dissipation unit of the thermal module.

In the above chassis heat dissipation structure, the at least one heat dissipation unit of the at least one thermal module has a first heat dissipation unit and a second heat dissipation unit. The second end of the at least one heat conduction unit is held between the first and second heat dissipation units.

In the above chassis heat dissipation structure, the heat generation module has at least one heat source. The at least one first end of the at least one heat conduction unit is in contact with the at least one heat source.

In the above chassis heat dissipation structure, the at least one first end of the at least one heat conduction unit is a fixed end fixed on the at least one heat source. The second end of the at least one heat conduction unit is a free end inserted in the at least one heat dissipation unit of the thermal module.

In the above chassis heat dissipation structure, the at least one heat dissipation unit of the thermal module has a first heat dissipation unit and a second heat dissipation unit. The second end of the at least one heat conduction unit is held between the first and second heat dissipation units.

In the above chassis heat dissipation structure, the second end of the at least one heat conduction unit is positioned in parallel to the heat generation module.

In the above chassis heat dissipation structure, the at least one heat conduction unit has a first bent section. The first bent section is positioned between the first and second ends. The second end of the at least one heat conduction unit is positioned normal to the heat generation module.

In the above chassis heat dissipation structure, the at least one heat dissipation unit of the thermal module is selected from a group consisting of a radiating fin assembly, a water-cooling module, a vapor chamber and any combination thereof.

In the above chassis heat dissipation structure, the thermal module is disposed on one side of the chassis main body, which side is open to an ambient environment outside the chassis main body. The thermal module is also in adjacency to an internal space of the chassis main body.

In the above chassis heat dissipation structure, the at least one heat conduction unit is selected from a group consisting of a heat pipe, a loop-type heat pipe, a vapor chamber and any combination thereof.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
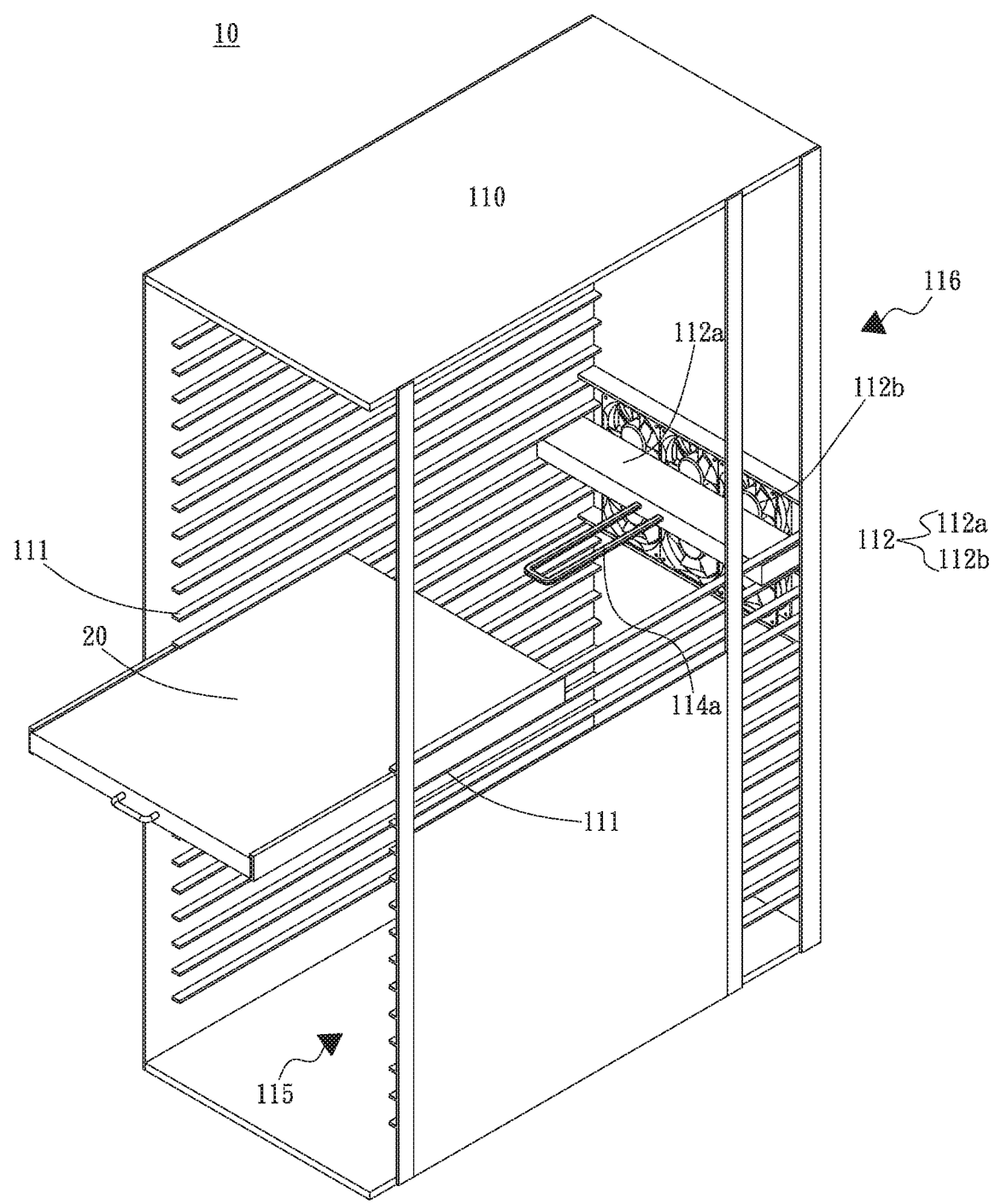
FIG. 1 is a perspective exploded view of a first embodiment of the chassis heat dissipation structure of the present invention.
Figure 2:
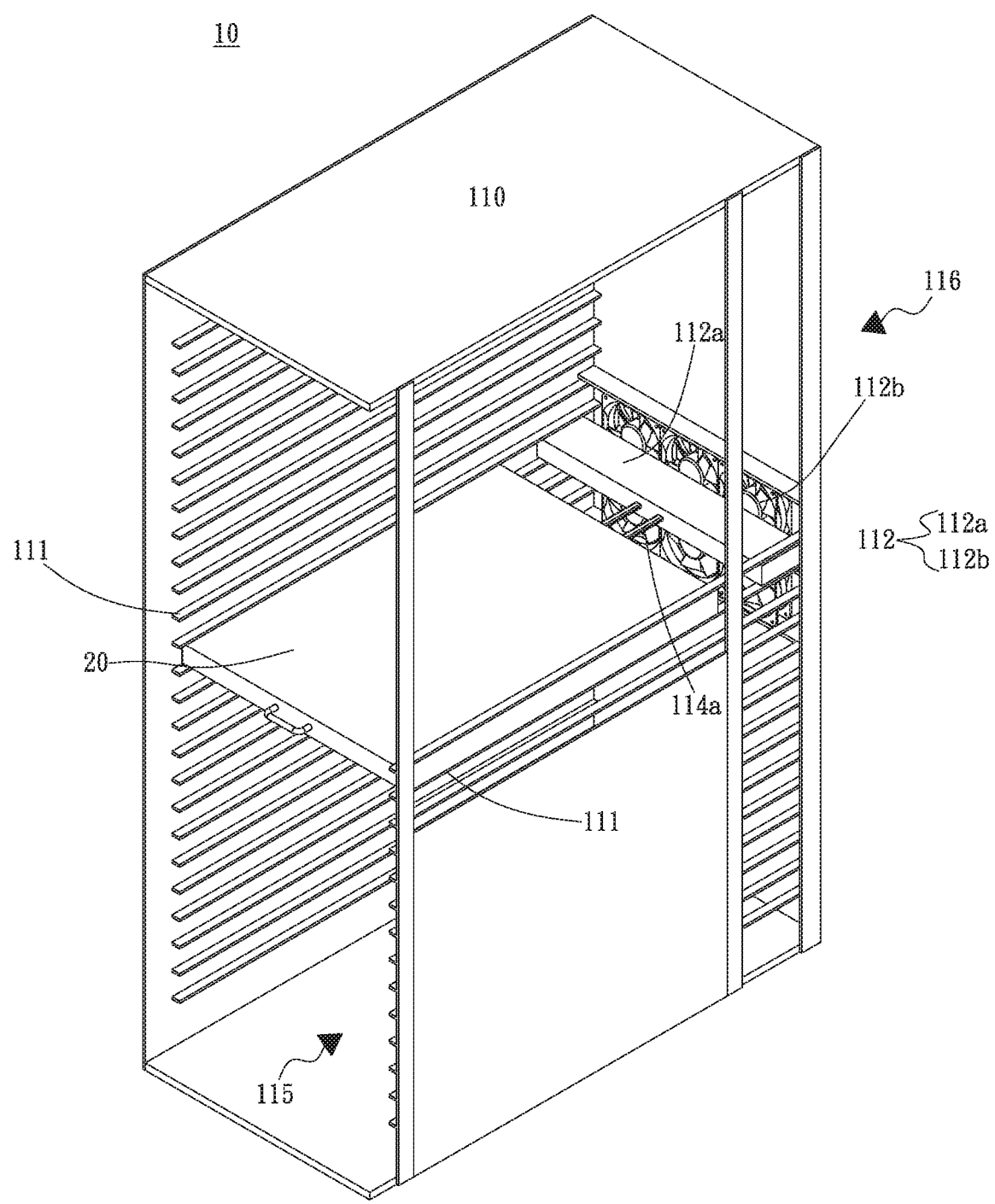
FIG. 2 is a perspective assembled view of the first embodiment of the chassis heat dissipation structure of the present invention.
Figure 3:
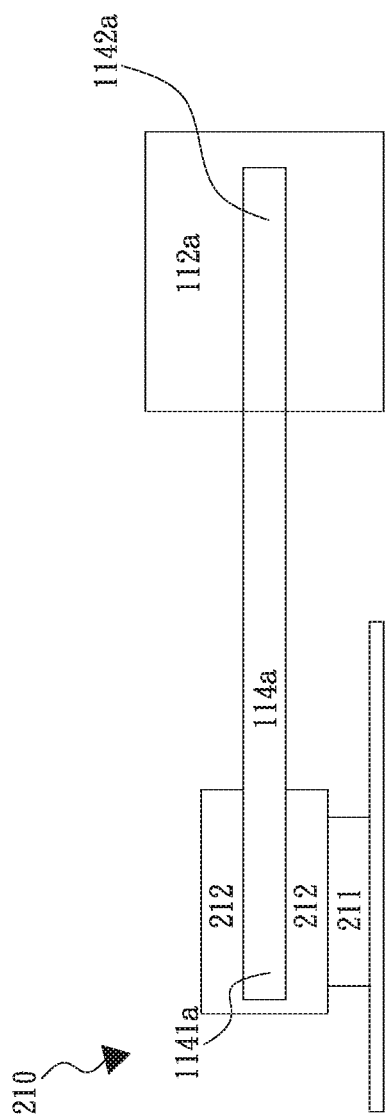
FIG. 3 is a side view of the heat dissipation unit and heat conduction unit of the first embodiment of the chassis heat dissipation structure of the present invention.
Figure 4:
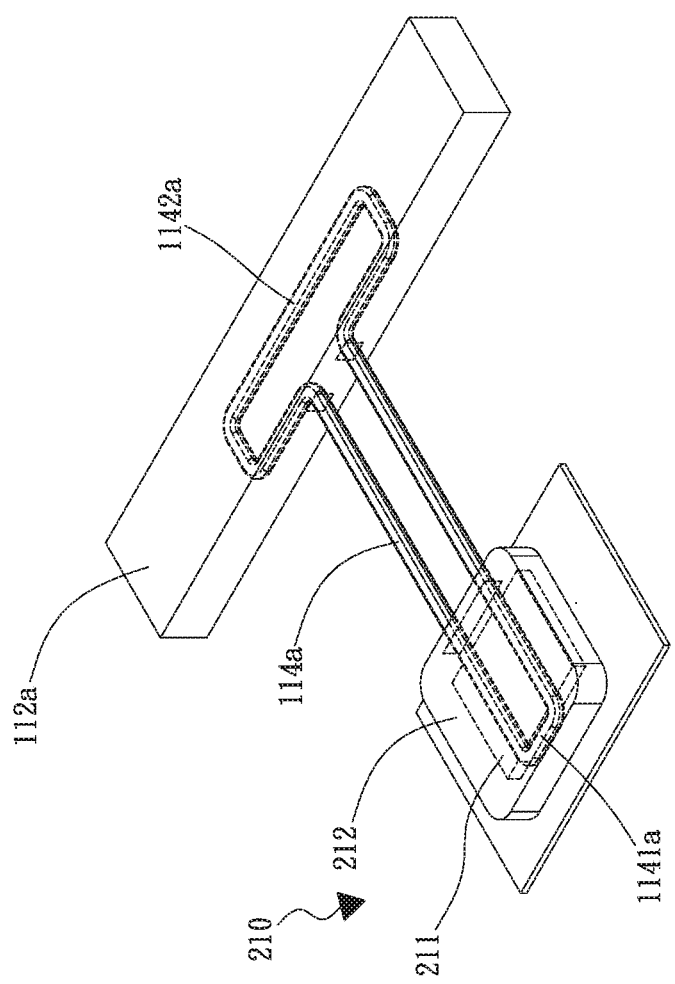
FIG. 4 is a perspective assembled view of the heat dissipation unit and heat conduction unit of the first embodiment of the chassis heat dissipation structure of the present invention.

Please refer to FIGS. 1, 2, 3 and 4. FIG. 1 is a perspective exploded view of a first embodiment of the chassis heat dissipation structure of the present invention. FIG. 2 is a perspective assembled view of the first embodiment of the chassis heat dissipation structure of the present invention. FIG. 3 is a side view of the heat dissipation unit and heat conduction unit of the first embodiment of the chassis heat dissipation structure of the present invention. FIG. 4 is a perspective assembled view of the heat dissipation unit and heat conduction unit of the first embodiment of the chassis heat dissipation structure of the present invention. According to the first embodiment, the chassis heat dissipation structure 10 of the present invention includes a chassis main body 110. The chassis main body 110 has a chassis support 111, a thermal module 112 and at least one heat conduction unit 114a. At least one server mainframe 20 is disposed on the chassis support 111.

In this embodiment, one server mainframe 20 is disposed on the chassis support 111. The server mainframe 20 has a heat generation module 210.

The heat generation module 210 has at least one heat source 211 and at least one base seat 212. In this embodiment, the heat generation module 210 has one heat source 211 and one base seat 212. The base seat 212 is disposed on the heat source 211. The heat source 211 is, but not limited to, an electronic component. In the present invention, the application of the chassis heat dissipation structure 10 is not limited. In addition, in this embodiment, the chassis main body 110 is, but not limited to, a half-open chassis main body. Alternatively, the chassis main body 110 can be a full-open chassis main body (without any sidewall such as support body) or a closed chassis main body.

The thermal module 112 is disposed on one side of the chassis main body 110, which side is open to an ambient environment 116 outside the chassis main body 110. The thermal module 112 is also in adjacency to an internal space 115 of the chassis main body 110. Accordingly, the thermal module 112 can transfer the heat of the internal space 115 of the chassis main body 110 to the ambient environment 116 to dissipate the heat. In this embodiment, the thermal module 112 is disposed on a rear side of the chassis main body 110. The thermal module 112 has at least one heat dissipation unit 112a and multiple fan units 112b. In this embodiment, the thermal module 112 has one heat dissipation unit 112a and multiple fan units 112b. The heat dissipation unit 112a is disposed between the fan units 112b and the server mainframe 20. The fan units 112b serve to carry the heat of the heat dissipation unit 112a to the ambient environment 116 for heat exchange and heat dissipation. In this embodiment, the heat dissipation unit 112a of the thermal module 112 is, but not limited to, selected from a group consisting of a radiating fin assembly, a water-cooling module and a vapor chamber. In a modified embodiment, the heat dissipation unit 112a of the thermal module 112 can be alternatively a combination of the radiating fin assembly, the water-cooling module and the vapor chamber. In practice, the heat dissipation unit 112a of the thermal module 112 can be any unit that is able to achieve the same heat dissipation effect.

The heat conduction unit 114a has at least one first end 1141a and a second end 1142a. In this embodiment, the heat conduction unit 114a has one first end 1141a and one second end 1142a. The first end 1141a is in contact with the heat generation module 210 of the server mainframe 20. The second end 1142a is in contact with the heat dissipation unit 112a of the thermal module 112. The base seat 212 of the heat generation module 210 is disposed on the heat source 211 so that the first end 1141a of the heat conduction unit 114a is in contact with the base seat 212 of the heat generation module 210. In this embodiment, the first end 1141a of the heat conduction unit 114a is a free end inserted in the base seat 212. The second end 1142a of the heat conduction unit 114a is a fixed end fixed in the heat dissipation unit 112a of the thermal module 112. The heat conduction unit 114a serves to conduct the heat of the heat generation module 210 to the heat dissipation unit 112a of the thermal module 112. The fan units 112b serve to carry the heat of the heat dissipation unit 112a to the ambient environment 116 to dissipate the heat. The heat dissipation means of the heat dissipation unit 112a and the fan units 112b substantially is heat conduction or heat convection or heat radiation or a combination thereof.

Figure 5:
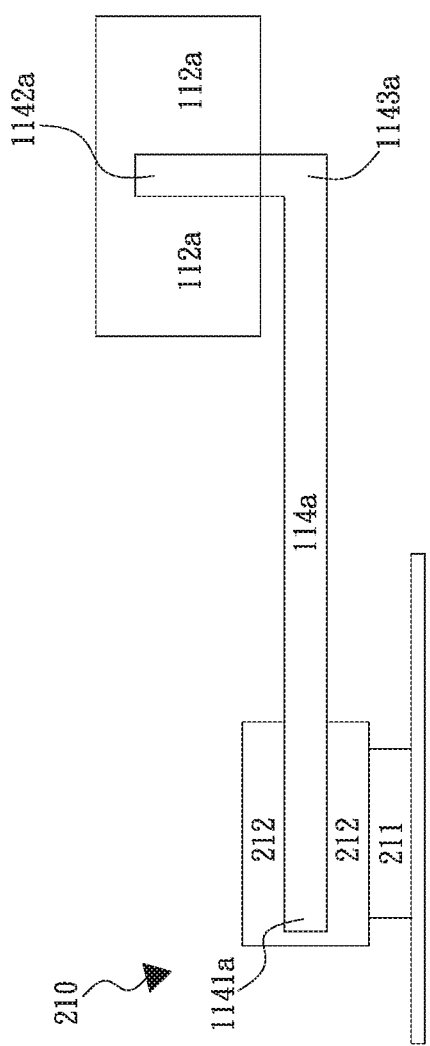
FIG. 5 is a side view of a modified embodiment of the first embodiment of the chassis heat dissipation structure of the present invention.

In this embodiment, the first end 1141a of the heat conduction unit 114a horizontally longitudinally extends to the second end 1142a and the second end 1142a is parallel to the heat generation module 210. As shown in FIG. 5, in a modified embodiment, the heat conduction unit 114a has a first bent section 1143a positioned between the first and second ends 1141a, 1142a. Accordingly, the second end 1142a of the heat conduction unit 114a is normal to the heat generation module 210.

In this embodiment, the heat conduction unit 114a is, but not limited to, a heat pipe. In a modified embodiment, the heat conduction unit 114a can be alternatively a vapor chamber or a loop-type heat pipe. In another modified embodiment, the heat conduction unit 114a can be alternatively a combination of the heat pipe, the vapor chamber, the loop-type heat pipe or any metal with heat conductivity. In practice, the heat conduction unit 114a of the present invention can be any unit that is able to achieve the same heat conduction effect.

According to the design of the present invention, the thermal module 112 is fixed on the chassis support 111. The second end 1142a of the heat conduction unit 114a is affixed to the heat dissipation unit 112a of the thermal module 112. The server mainframe 20 can be disposed on the chassis support 111 of the chassis main body 110 from the ambient environment. Accordingly, the first end 1141a of the heat conduction unit 114a is inserted in the base seat 212 of the heat generation module 210 of the server mainframe 20. When the heat source 211 of the heat generation module 210 of the server mainframe 20 operates to generate heat, the base seat 212 absorbs the heat of the heat source 211 and then the first end 1141a of the heat conduction unit 114a absorbs the heat of the base seat 212.

In the case that the heat conduction unit 114a is a heat pipe or a vapor chamber or a loop-type heat pipe, the heat conduction unit 114a is formed with an internal chamber as a flow way of a working fluid. The working fluid contained in the chamber is phase-changed, that is, evaporated and condensed and flows through the chamber to transfer the heat. The heat pipe or the vapor chamber or the loop-type heat pipe serves as a remote-end heat conduction member, whereby the low-boiling-point working fluid filled in the heat pipe or the vapor chamber or the loop-type heat pipe will absorb heat and evaporate at the first end 1141a. The vapor working fluid will flow to the second end 1142a. At the second end 1142a, the working fluid transfers the heat generated by the heat source 211 to the heat dissipation unit 112a of the thermal module 112. Then, the fan units 112b carry the heat of the heat dissipation unit 112a to the ambient environment 116 to dissipate the heat.

Accordingly, the possibility that the thermal module 112 transfers heat to the internal space 115 of the chassis main body 110 is reduced so that the heat dissipation effect for the internal space 115 of the chassis main body 110 is enhanced.

Also, the thermal module 112 will not occupy the internal space 115 of the chassis main body 110. Moreover, the heat conduction unit 114a can be disposed in parallel to the heat generation module 210 or normal to the heat generation module 210. Under such circumstance, the use flexibility of the internal space 115 of the chassis main body 110 is greatly increased.

Figure 6:
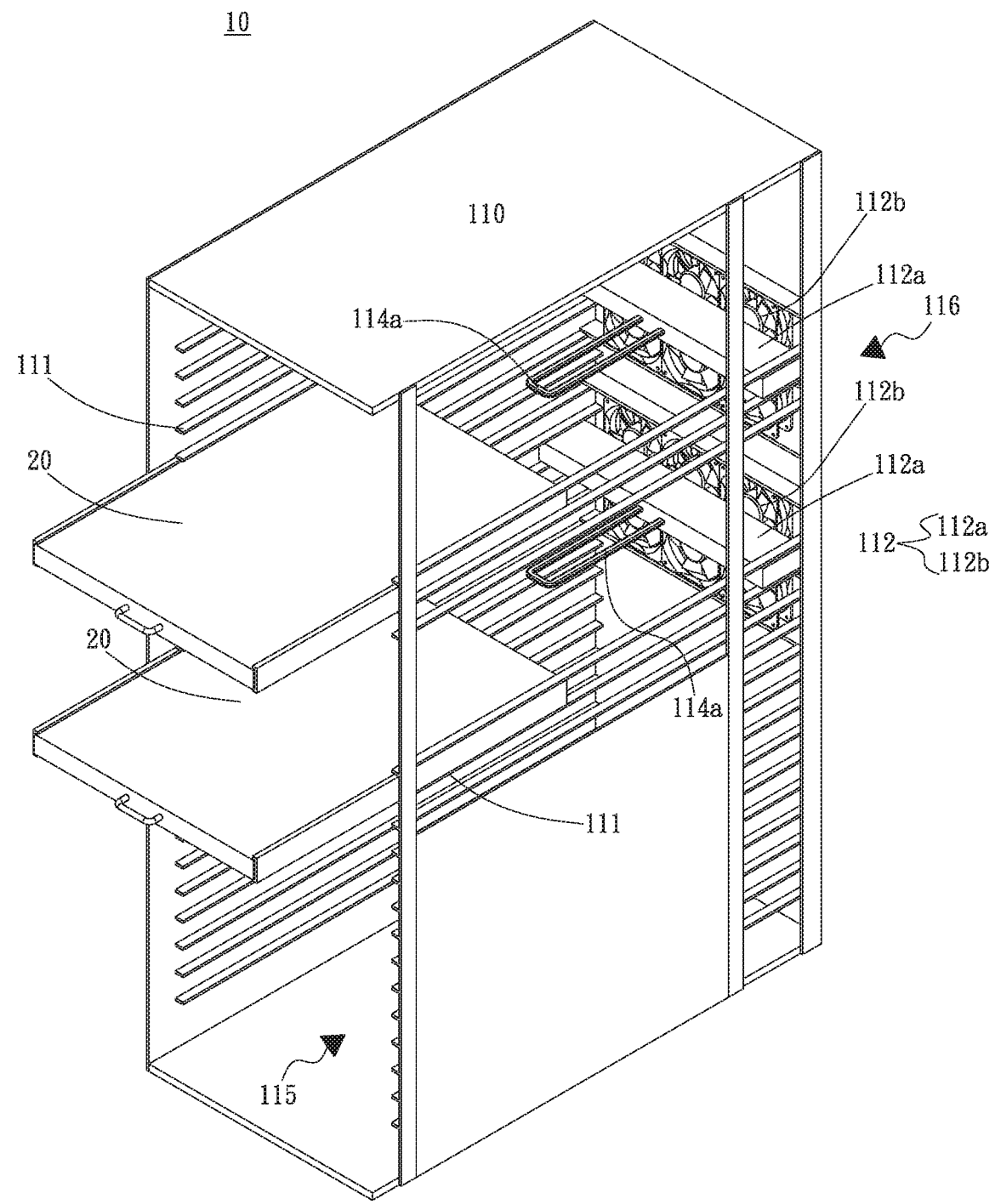
FIG. 6 is a perspective exploded view of a second embodiment of the chassis heat dissipation structure of the present invention.

Please now refer to FIG. 6, which is a perspective exploded view of a second embodiment of the chassis heat dissipation structure of the present invention. Also supplementally referring to FIGS. 1 to 5, the second embodiment is partially identical to the first embodiment in structure and function and thus will not be redundantly described hereinafter. The second embodiment is different from the first embodiment in that two server mainframes 20 are disposed on the chassis support 111 at an interval and stacked on each other. The thermal module 112 has two heat dissipation units 112a corresponding to the server mainframes 20. Also, the chassis main body 110 has two heat conduction units 114a respectively disposed between the server mainframes 20 and the heat dissipation units 112a. The first ends 1141a of the heat conduction units 114a are respectively in contact with the heat generation modules 210 of the server mainframes 20. The second ends 1142a of the heat conduction units 114a are respectively in contact with the heat dissipation units 112a. The number of the server mainframes 20 of the present invention is not limited to one or two. In practice, there can be more than two server mainframes 20 and the number of the heat dissipation units 112a and the number of the heat conduction units 114a are equal to the number of the server mainframes 20.

Also, one server mainframe 20 certainly can have multiple heat generation modules 210. One single heat conduction unit 114a can be serially connected with the multiple heat generation modules 210 and in contact with the multiple heat generation modules 210 to conduct the heat. Alternatively, multiple heat conduction units 114a can be respectively connected with the multiple heat generation modules 210 and in contact with the multiple heat generation modules 210 to conduct the heat to the heat dissipation units 112a for heat exchange and heat dissipation.

Figure 7:
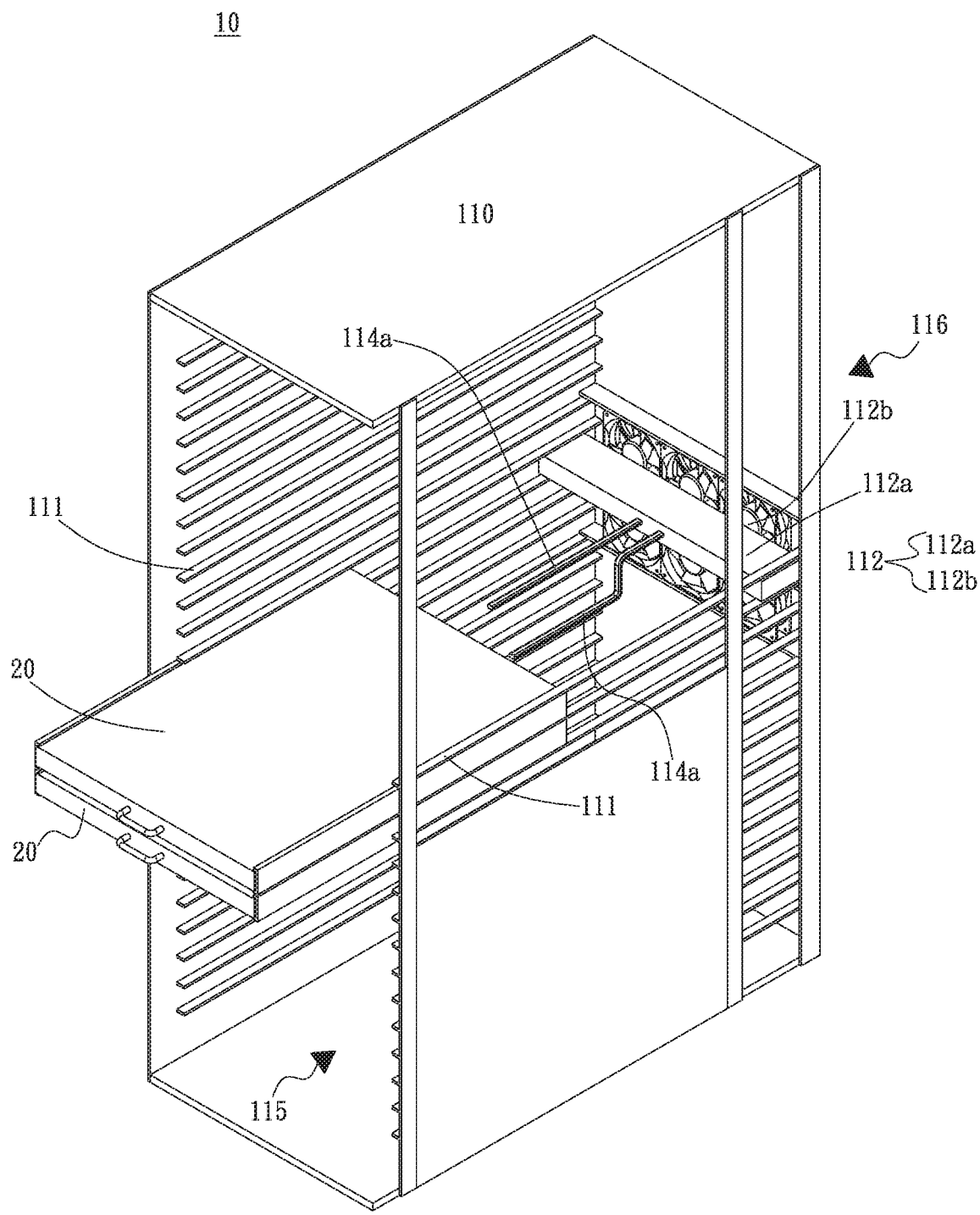
FIG. 7 is a perspective exploded view of a third embodiment of the chassis heat dissipation structure of the present invention.
Figure 8:
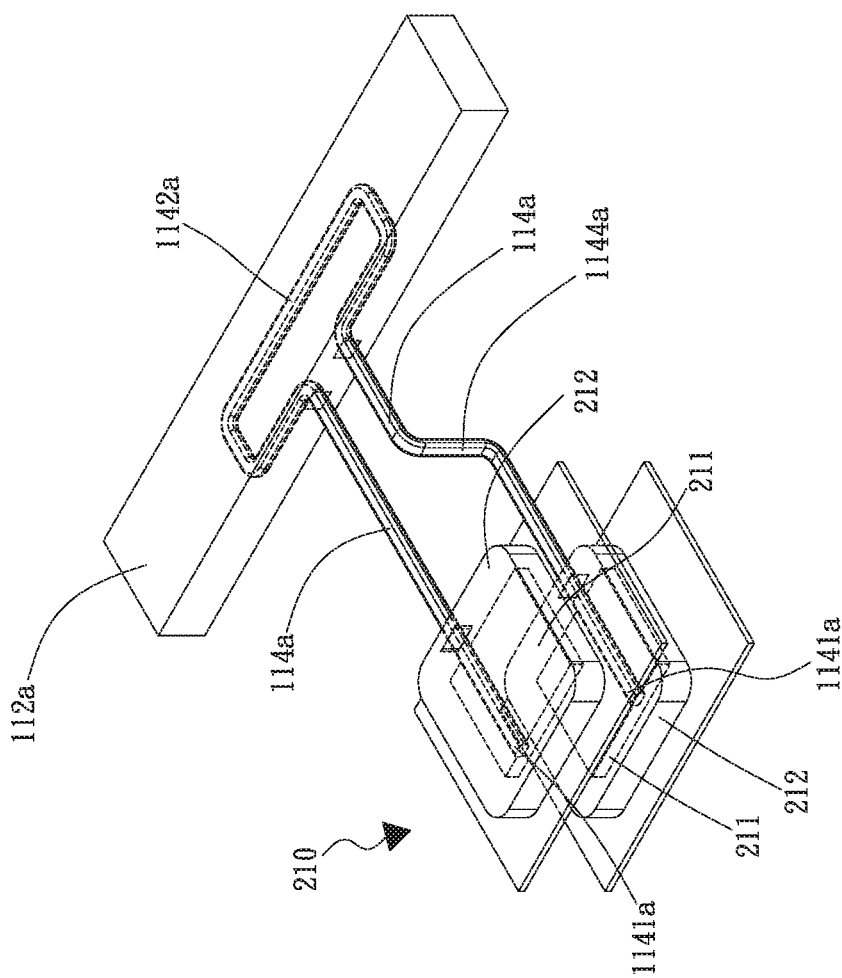
FIG. 8 is a perspective assembled view of the heat dissipation unit and heat conduction unit of the third embodiment of the chassis heat dissipation structure of the present invention.

Please now refer to FIGS. 7 and 8. FIG. 7 is a perspective exploded view of a third embodiment of the chassis heat dissipation structure of the present invention. FIG. 8 is a perspective assembled view of the heat dissipation unit and heat conduction unit of the third embodiment of the chassis heat dissipation structure of the present invention. Also supplementally referring to FIGS. 1 to 6, the third embodiment is partially identical to the second embodiment in structure and function and thus will not be redundantly described hereinafter. The third embodiment is different from the second embodiment in that the thermal module 112 has a heat dissipation unit 112a corresponding to the server mainframe 20. Also, the chassis main body 110 has only one heat conduction unit 114a disposed between the server mainframe 20 and the heat dissipation unit 112a. The heat conduction unit 114a has two first ends 1141a and one second end 1142a. In this embodiment, the heat conduction unit 114a has one first end 1141a and one second end 1142a. In addition, a second bent section 1144a is connected between one of the first ends 1141a and the second end 1142a. Accordingly, in adaptation to the server mainframes 20 which are disposed at an interval and stacked on each other, the first ends 1141a of the heat conduction unit 114a are respectively in contact with the base seats 212 of the heat generation modules 210.

Figure 9:
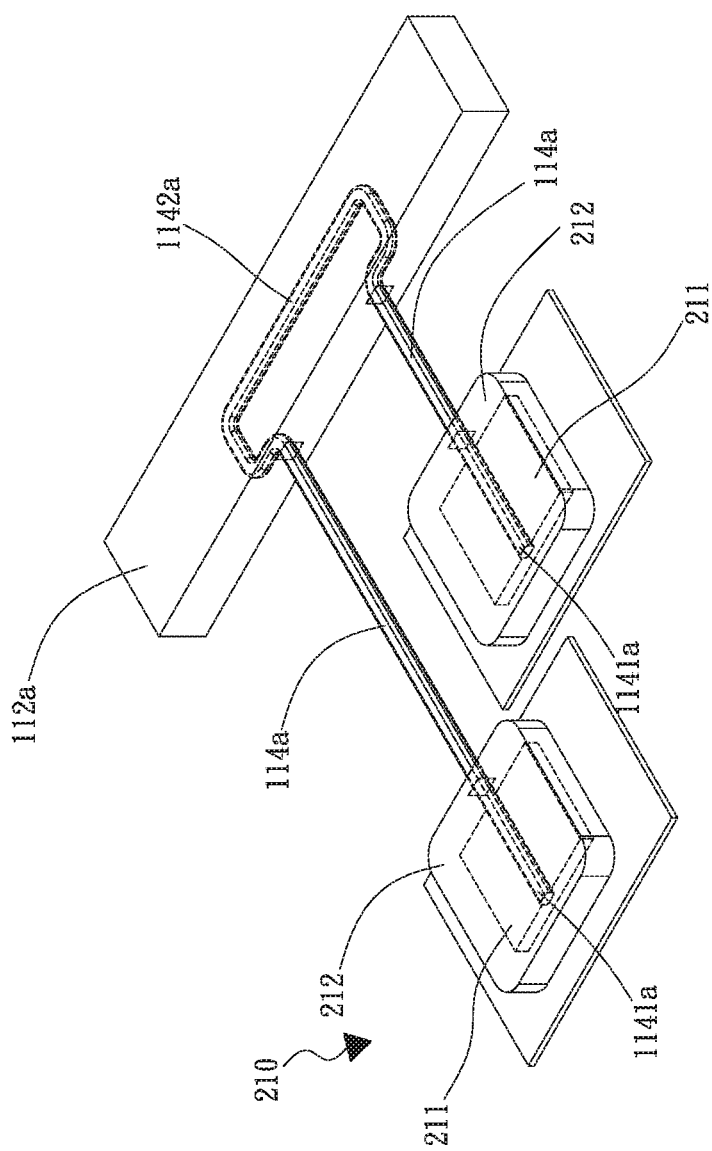
FIG. 9 is a perspective assembled view of the heat dissipation unit and heat conduction unit of a fourth embodiment of the chassis heat dissipation structure of the present invention.

Please now refer to FIG. 9, which is a perspective assembled view of the heat dissipation unit and heat conduction unit of a fourth embodiment of the chassis heat dissipation structure of the present invention. Also supplementally referring to FIGS. 1 to 5, the fourth embodiment is partially identical to the first embodiment in structure and function and thus will not be redundantly described hereinafter. The fourth embodiment is different from the first embodiment in that the heat generation module 210 of the server mainframe 20 has multiple heat sources 211 and multiple base seats 212 corresponding to the heat sources 211. The heat sources 211 are arranged in parallel to each other. The base seats 212 are respectively disposed on the heat sources 211. The heat conduction unit 114a has two first ends 1141a arranged in parallel to each other at an intervals and one second end 1142a. The first ends 1141a are respectively in contact with the base seats 212 of the heat generation modules 210. The number of the heat sources 211 and the base seats 212 of the heat generation module 210 of the present invention is not limited to one or two. In practice, there can be more than two heat sources 211 and base seats 212 and the number of the first end 1141a of the heat conduction unit 114a is equal to the number of the heat sources 211 and base seats 212.

Figure 10:
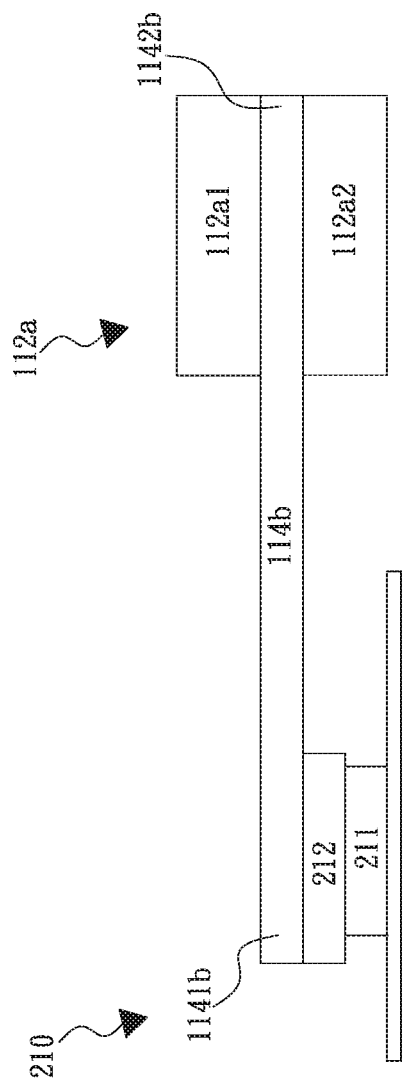
FIG. 10 is a side view of the heat dissipation unit and heat conduction unit of a fifth embodiment of the chassis heat dissipation structure of the present invention.
Figure 11:
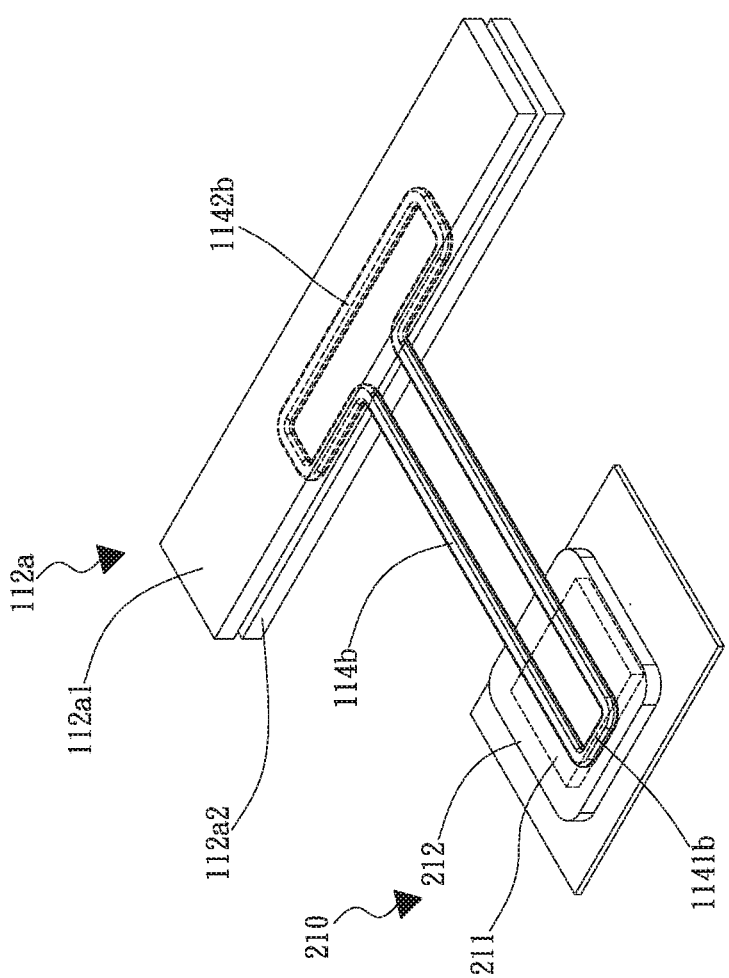
FIG. 11 is a perspective assembled view of the heat dissipation unit and heat conduction unit of the fifth embodiment of the chassis heat dissipation structure of the present invention.

Please now refer to FIGS. 10 and 11. FIG. 10 is a side view of the heat dissipation unit and heat conduction unit of a fifth embodiment of the chassis heat dissipation structure of the present invention. FIG. 11 is a perspective assembled view of the heat dissipation unit and heat conduction unit of the fifth embodiment of the chassis heat dissipation structure of the present invention. Also supplementally referring to FIGS. 1 to 5, the fifth embodiment is partially identical to the first embodiment in structure and function and thus will not be redundantly described hereinafter. The fifth embodiment is different from the first embodiment in that the first end 1141b of the heat conduction unit 114b is a fixed end fixed on the base seat 212. The second end 1142b of the heat conduction unit 114b is a free end inserted in the heat dissipation unit 112a of the thermal module 112. The heat dissipation unit 112a of the thermal module 112 includes a first heat dissipation unit 112a1 and a second heat dissipation unit 112a2. The second end 1142b of the heat conduction unit 114b is held between the first and second heat dissipation units 112a1, 112a2.

Figure 12:
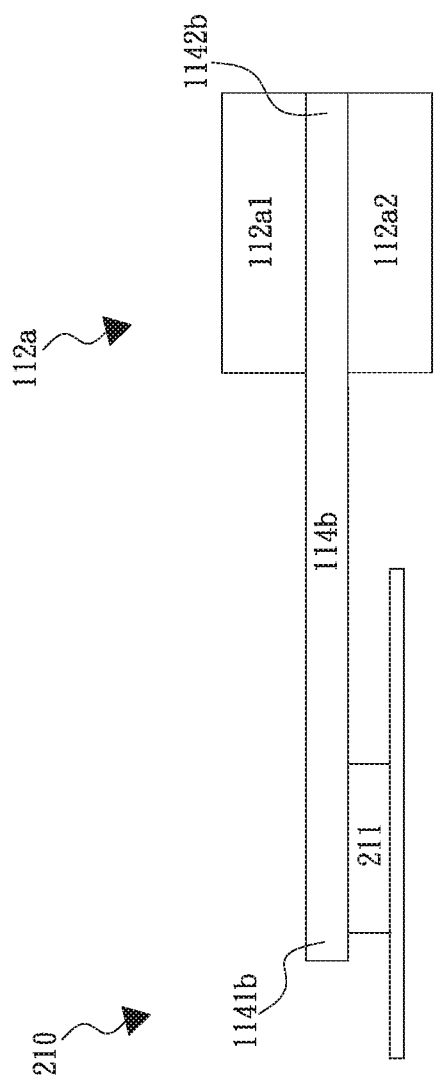
FIG. 12 is a side view of a modified embodiment of the fifth embodiment of the chassis heat dissipation structure of the present invention.

In addition, in a modified embodiment as shown in FIG. 12, the heat generation module 210 of the server mainframe 20 has the heat source 211 without the base seat 212. The first end 1141b of the heat conduction unit 114b is fixed on the heat source 211. The second end 1142b of the heat conduction unit 114b is inserted in the heat dissipation unit 112a of the thermal module 112.

Accordingly, the first end 1141b of the heat conduction unit 114b is fixed on the base seat 212 or the heat source 211 of the server mainframe 20. The server mainframe 20 can be disposed on the chassis support 111 of the chassis main body 110 from the ambient environment. The second end 1142b of the heat conduction unit 114b is inserted in the heat dissipation unit 112a of the thermal module 112 and held between the first and second heat dissipation units 112a1, 112a2. This can achieve the same effect as the first embodiment.

Figure 13:
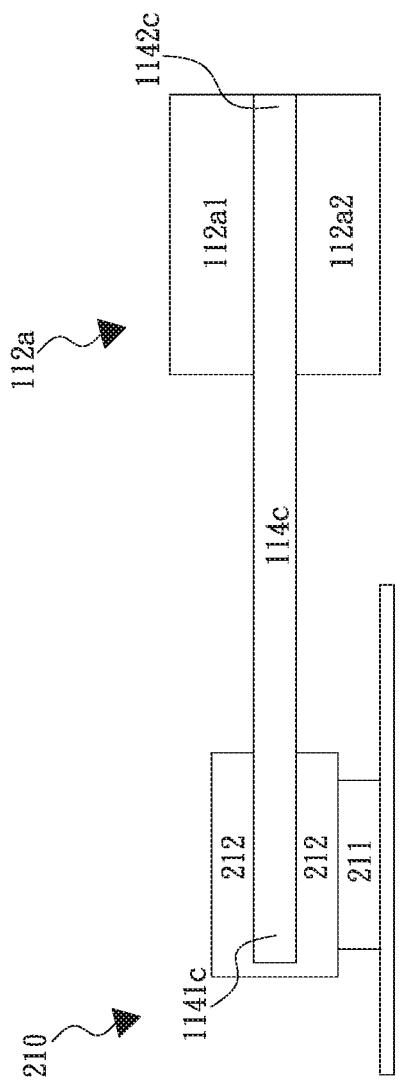
FIG. 13 is a side view of the heat dissipation unit and heat conduction unit of a sixth embodiment of the chassis heat dissipation structure of the present invention.
Figure 14:
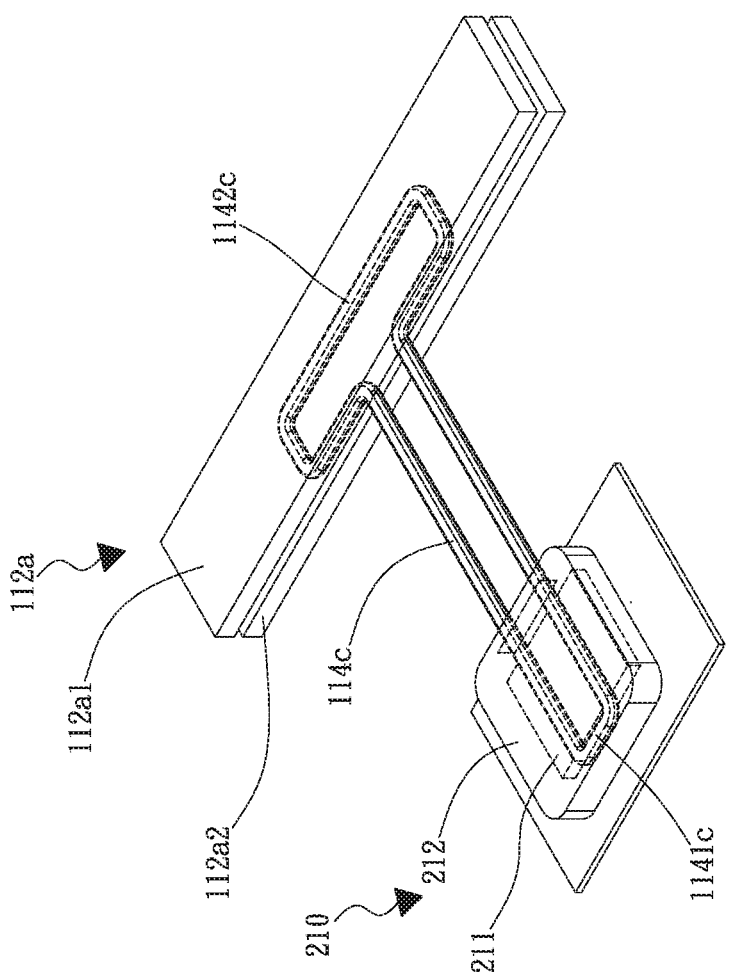
FIG. 14 is a perspective assembled view of the heat dissipation unit and heat conduction unit of the sixth embodiment of the chassis heat dissipation structure of the present invention.

Please now refer to FIGS. 13 and 14. FIG. 13 is a side view of the heat dissipation unit and heat conduction unit of a sixth embodiment of the chassis heat dissipation structure of the present invention. FIG. 14 is a perspective assembled view of the heat dissipation unit and heat conduction unit of the sixth embodiment of the chassis heat dissipation structure of the present invention. Also supplementally referring to FIGS. 1 to 4 and 10 to 12, the sixth embodiment is partially identical to the fifth embodiment in structure and function and thus will not be redundantly described hereinafter. The sixth embodiment is different from the fifth embodiment in that the first end 1141c of the heat conduction unit 114c is a free end inserted in the base seat 212, while the second end 1142c of the heat conduction unit 114c is another free end inserted in the heat dissipation unit 112a of the thermal module 112.

In a preferred embodiment, the first end 1141c of the heat conduction unit 114c is inserted in the server mainframe 20 and then the server mainframe 20 is disposed on the chassis support 111, while the second end 1142c of the heat conduction unit 114c is inserted in the heat dissipation unit 112a of the thermal module 112. In another preferred embodiment, the second end 1142c of the heat conduction unit 114c is inserted in the heat dissipation unit 112a of the thermal module 112 and then the server mainframe 20 is disposed on the chassis support 111, while the first end 1141c of the heat conduction unit 114c is inserted in the server mainframe 20. This can achieve the same effect as the fifth embodiment.

Accordingly, the heat conduction units 114a, 114b, 114c of the chassis heat dissipation structure 10 of the present invention serve to conduct the heat of the heat generation module 210 to the thermal module 112. The fan units 112b serve to carry away the heat of the thermal module 112 to dissipate the heat. Therefore, the heat dissipation effect of the internal space 115 of the chassis main body 110 is enhanced. Also, multiple heat conduction units 114a, 114b, 114c and multiple heat dissipation units 112a can be arranged corresponding to multiple server mainframes 20. Alternatively, one heat conduction unit 114a, 114b, 114c and one heat dissipation unit 112a can be arranged corresponding to multiple server mainframes 20. Still alternatively, one heat conduction unit 114a, 114b, 114c and one heat dissipation unit 112a can be arranged corresponding to multiple heat generation modules 210 of one server mainframe 20. In addition, it is unnecessary to dispose the thermal module 112 on the server mainframe 20. This can prevent the internal space 115 of the chassis main body 110 from being occupied. Moreover, the heat conduction unit 114a, 114b, 114c can be positioned in parallel to the heat generation module 210 or normal to the heat generation module 210. Under such circumstance, the use flexibility of the internal space 115 of the chassis main body 110 is increased.

The present invention has been described with the above embodiments thereof and it is understood that many changes and modifications in such as the form or layout pattern or practicing step of the above embodiments can be carried out without departing from the scope and the spirit of the invention that is intended to be limited only by the appended claims.

What is claimed is:

1. A chassis heat dissipation structure comprising:
at least one server mainframe
a heat generation module with at least one heat source and at least one base seat disposed on the at least one heat source,
a chassis main body having a chassis support wherein the at least one server mainframe is disposed on the chassis support,
a thermal module having multiple fan units and at least one heat dissipation unit disposed between the fan units and the at least one server mainframe, and
at least one heat conduction unit having at least one first end in contact with the at least one base seat and a second end in contact with the at least one heat dissipation unit of the thermal module, wherein the at least one first end of the at least one heat conduction unit is a removable free end slideably inserted in the at least one base seat and the second end of the at least one heat conduction unit is a fixed end affixed to the at least one heat dissipation unit of the thermal module and the at least one heat conduction unit has a substantially constant cross-sectional area between the at least one first end and the second end and serves to conduct heat of the heat generation module to the at least one heat dissipation unit, the fan units serving to carry away and dissipate heat of the at least one heat dissipation unit.

2. The chassis heat dissipation structure as claimed in claim 1, wherein the at least one heat dissipation unit of the at least one thermal module has a first heat dissipation unit and a second heat dissipation unit, the second end of the at least one heat conduction unit being held between the first and second heat dissipation units.

3. A chassis heat dissipation structure comprising:
at least one server mainframe with a heat generation module having at least one heat source;
a chassis main body having a chassis support wherein the at least one server mainframe is disposed on the chassis support;
a thermal module having multiple fan units and at least one heat dissipation unit disposed between the fan units and the at least one server mainframe; and
at least one heat conduction unit having at least one fixed first end fixed on the at least one heat source and a second end in contact with the at least one heat dissipation unit of the thermal module, the at least one heat conduction unit having a substantially constant cross-sectional area between the at least one first end and the second end and serving to conduct heat of the heat generation module to the at least one heat dissipation unit, the fan units serving to carry away and dissipate heat of the at least one heat dissipation unit.

4. The chassis heat dissipation structure as claimed in claim 3, wherein the second end of the at least one heat conduction unit is a removable free end slideably inserted in the at least one heat dissipation unit of the thermal module.

5. The chassis heat dissipation structure as claimed in claim 4, wherein the at least one heat dissipation unit of the thermal module has a first heat dissipation unit and a second heat dissipation unit, the second end of the at least one heat conduction unit being held between the first and second heat dissipation units.

6. The chassis heat dissipation structure as claimed in claim 1, wherein the second end of the at least one heat conduction unit is positioned in parallel to the heat generation module.

7. The chassis heat dissipation structure as claimed in claim 1, wherein the at least one heat conduction unit has a first bent section, the first bent section being positioned between the first and second ends, the second end of the at least one heat conduction unit is positioned normal to the heat generation module.

8. The chassis heat dissipation structure as claimed in claim 1, wherein the at least one heat dissipation unit of the thermal module is selected from a group consisting of a radiating fin assembly, a water-cooling module, a vapor chamber and any combination thereof.

9. The chassis heat dissipation structure as claimed in claim 1, wherein the thermal module is disposed on one side of the chassis main body, which side is open to an ambient environment outside the chassis main body, the thermal module being also in adjacency to an internal space of the chassis main body.

10. The chassis heat dissipation structure as claimed in claim 1, wherein the at least one heat conduction unit is selected from a group consisting of a heat pipe, a loop-type heat pipe, a vapor chamber and any combination thereof.

11. A chassis heat dissipation structure comprising:
at least one server mainframe
a heat generation module with at least one heat source and at least one base seat disposed on the at least one heat source,
a chassis main body having a chassis support wherein the at least one server mainframe is disposed on the chassis support,
a thermal module having multiple fan units and at least one heat dissipation unit disposed between the fan units and the at least one server mainframe, and
at least one heat conduction unit having at least one fixed first end fixed on the at least one base seat and a removable free second end of the at least one heat conduction unit slideably inserted in the at least one heat dissipation unit of the thermal module, wherein the at least one heat conduction unit has a substantially constant cross-sectional area between the at least one fixed first end and the removable free second end and serves to conduct heat of the heat generation module to the at least one heat dissipation unit, the fan units serving to carry away and dissipate heat of the at least one heat dissipation unit.

12. The chassis heat dissipation structure of claim 11, wherein the at least one heat dissipation unit of the at least one thermal module has a first heat dissipation unit and a second heat dissipation unit, the second end of the at least one heat conduction unit being held between the first and second heat dissipation units.

13. The chassis heat dissipation structure as claimed in claim 11, wherein the at least one heat conduction unit has a first bent section, the first bent section being positioned between the first and second ends, the second end of the at least one heat conduction unit is positioned normal to the heat generation module.

14. A chassis heat dissipation structure comprising:
at least one server mainframe
a heat generation module with at least one heat source and at least one base seat disposed on the at least one heat source,
a chassis main body having a chassis support wherein the at least one server mainframe is disposed on the chassis support,
a thermal module having multiple fan units and at least one heat dissipation unit disposed between the fan units and the at least one server mainframe, and
at least one heat conduction unit having at least one first fixed end slideably inserted in the at least one base seat and a second removable free end slideably inserted in the at least one heat dissipation unit of the thermal module, wherein the at least one heat conduction unit has a substantially constant cross-sectional area between the at least one fixed first end and the removable free second end and serves to conduct heat of the heat generation module to the at least one heat dissipation unit, the fan units serving to carry away and dissipate heat of the at least one heat dissipation unit.

15. The chassis heat dissipation structure of claim 14, wherein the at least one heat dissipation unit of the at least one thermal module has a first heat dissipation unit and a second heat dissipation unit, the second end of the at least one heat conduction unit being held between the first and second heat dissipation units.

16. The chassis heat dissipation structure as claimed in claim 14, wherein the at least one heat conduction unit has a first bent section, the first bent section being positioned between the first and second ends, the second end of the at least one heat conduction unit is positioned normal to the heat generation module.

\* \* \* \* \*